(12) United States Patent (10) Patent No.: US 8,972,685 B2
Bains et al. (45) Date of Patent: Mar. 3, 2015

(54) METHOD, APPARATUS AND SYSTEM FOR EXCHANGING COMMUNICATIONS VIA A COMMAND/ADDRESS BUS

(71) Applicants: Kuljit S. Bains, Olympia, WA (US); James A. McCall, Portland, OR (US)

(72) Inventors: Kuljit S. Bains, Olympia, WA (US); James A. McCall, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 193 days.

(21) Appl. No.: 13/725,820

(22) Filed: Dec. 21, 2012

(65) Prior Publication Data

US 2014/0181390 A1    Jun. 26, 2014

(51) Int. Cl.
*G06F 12/00* (2006.01)
*G11C 7/10* (2006.01)
*G11C 7/22* (2006.01)
*G11C 11/4076* (2006.01)
*G11C 11/4093* (2006.01)

(52) U.S. Cl.
CPC .............. *G06F 12/00* (2013.01); *G11C 7/1072* (2013.01); *G11C 7/1045* (2013.01); *G11C 7/109* (2013.01); *G11C 7/22* (2013.01); *G11C 11/4076* (2013.01); *G11C 11/4093* (2013.01)
USPC .......................... 711/167; 365/233.1; 711/105

(58) Field of Classification Search
None
See application file for complete search history.

(56) References Cited

U.S. PATENT DOCUMENTS

| | | | |
|---|---|---|---|
| 7,516,290 B2 * | 4/2009 | Machimura | 711/167 |
| 2005/0204111 A1 * | 9/2005 | Natarajan | 711/167 |
| 2007/0217559 A1 | 9/2007 | Stott et al. | |
| 2009/0059680 A1 | 3/2009 | Lee et al. | |
| 2009/0322387 A1 | 12/2009 | Jang et al. | |
| 2010/0027358 A1 | 2/2010 | Lee | |
| 2011/0161713 A1 * | 6/2011 | Methar et al. | 713/400 |
| 2011/0208988 A1 * | 8/2011 | Kim et al. | 713/500 |

FOREIGN PATENT DOCUMENTS

| | | |
|---|---|---|
| KR | 1020110109126 | 10/2011 |
| KR | 1020120109958 | 10/2012 |

OTHER PUBLICATIONS

"PCT, International Search Report and Written Opinion of the International Searching Authority for International Application No. PCT/US2013/045439", (Sep. 16, 2013), Whole Document.

* cited by examiner

*Primary Examiner* — Gary Portka
(74) *Attorney, Agent, or Firm* — Blakely, Sokoloff, Taylor & Zafman LLP

(57) ABSTRACT

Techniques and mechanisms for exchanging information from a memory controller to a memory device via a command/address bus. In an embodiment, the memory device samples a first portion of a command during a first sample period and samples a second portion of the command during a second sample period, the first portion and second portion exchanged via the command/address bus. The first sample period and the second sample period are concurrent with, respectively, a first transition of a clock signal and a second transition of the clock signal. In another embodiment, a mode of the memory device determines a relationship between the first transition and the second transition.

30 Claims, 8 Drawing Sheets

METHOD, APPARATUS AND SYSTEM FOR EXCHANGING COMMUNICATIONS VIA A COMMAND/ADDRESS BUS

BACKGROUND

1. Technical Field

Embodiments of the invention are generally related to operation of a memory device, and more particularly, but not exclusively, to a communication exchange between a memory device and a memory controller.

2. Background Art

In computer memory systems, such as those complying with the LPDDR3 standard JESD209-3 of the Joint Electron Devices Engineering Council (JEDEC), communications are exchanged between a memory controller and one or more memory devices via a command/address bus. The term "command/address" (also "CA" or "C/A") refers to the characteristic of supporting or otherwise including either or both of command information and address information. LPDDR3 is one example of a standard which provides for training of a CA bus, which aids in compensating signal skew and other such impediments to communication between a memory controller and a memory device. CA bus training helps to assure that such communication is in compliance with timing requirements of the LPDDR3 standard.

Currently, LPDDR3 provides for sending an individual command over two transitions of a data clock. A first portion of such a command is sent via the CA bus on a rising transition of the data clock and a second portion of the command is sent via the CA bus on the falling transition of the data clock. This type of transfer timing is referred to as double data rate (DDR).

The burden imposed by implementing DDR increases as successive generations of memory system technology continue to push toward faster operating speeds, including faster data clock rates. Moreover, these successive generations increasingly implement efficiency mechanisms which rely on more frequent transitions into deeper power saving states. Recovery from such states often requires additional CA bus training The requirements of CA bus training are at cross-purposes with the trend toward faster operating speeds, deeper power saving states, and more frequent transitions into and out of such power saving states. Accordingly, implementing CA bus training in next-generation memory systems is increasingly challenging.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide techniques and/or mechanisms for different modes of a memory device for exchanging information with a memory controller via a command/address bus. A memory device may sample, during a first period, a first portion of a command provided via a command/address bus, and further sample, during a second period, a second portion of the command provided via the command/address bus. In an embodiment, a middle of the first sample period is synchronized with a first transition of a clock signal, and a middle of the second sample period is synchronized with a second transition of the clock signal.

A mode of the memory device may determine a relationship between the first transition and the second transition. By way of illustration and not limitation, if the memory device is in a first mode, then the second transition is an Nth transition of the clock signal after the first transition, wherein N is an integer greater than one. Alternatively or in addition, if the memory device is in a second mode, then the second transition is a next transition of the clock signal after the first transition. In an embodiment, the first mode is a default mode—e.g. where the memory device automatically returns to the first mode in response to an initialization event of a predetermined event type of such as a power down, a power up, a Reset, a transition to (or from) a particular low power state, and/or the like.

Figure 1:
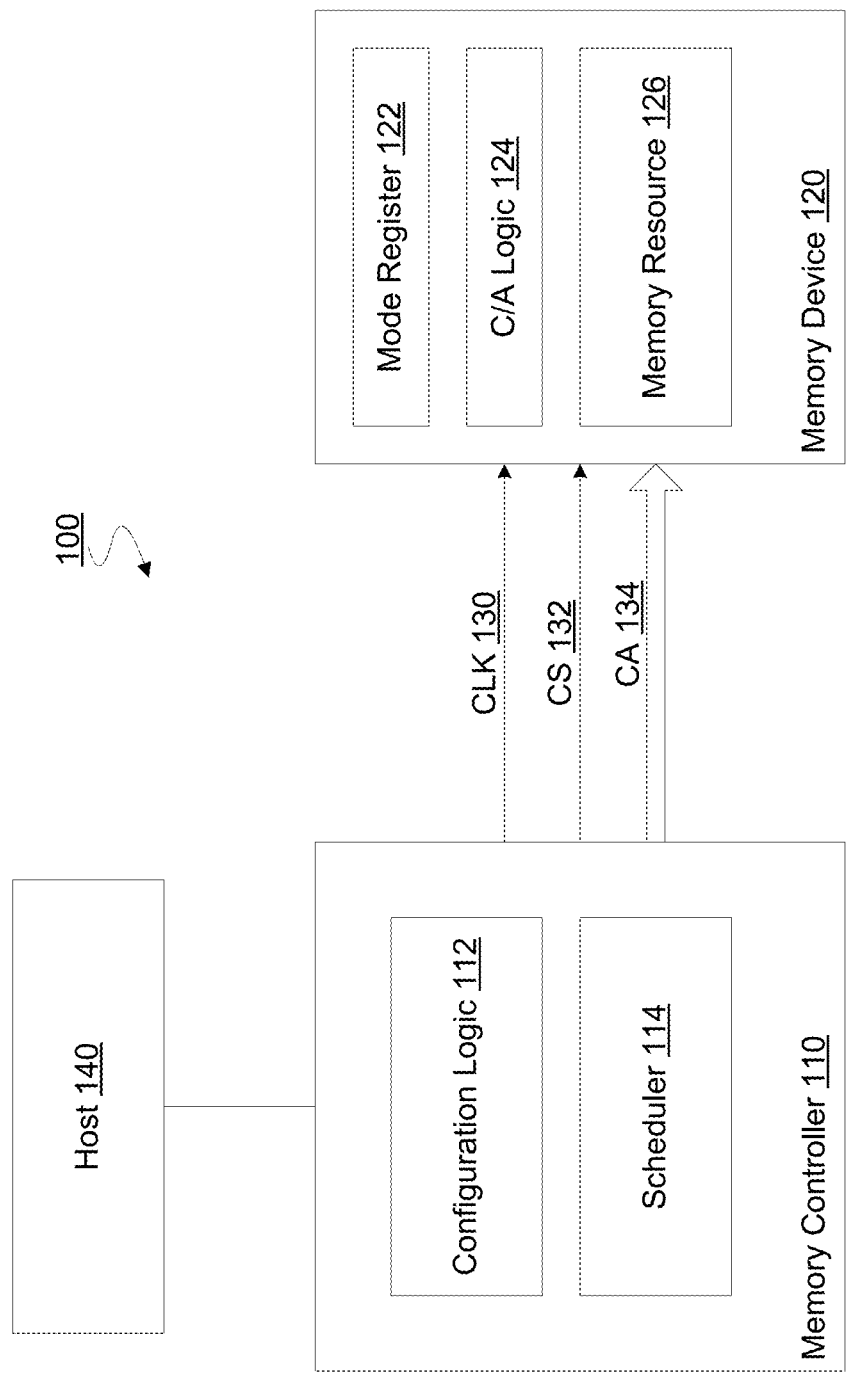
FIG. 1 is a block diagram illustrating elements of a memory system for exchanging command/address communications according to an embodiment.

FIG. 1 illustrates elements of a system 100 for exchanging command/address communications according to an embodiment. System 100 may include memory device 120 coupled to memory controller 110—e.g. where memory device 120 includes dynamic random access memory (DRAM) technology. In an embodiment, one or more features of memory device 120 are according to, or otherwise compatible with, a DRAM memory device specification such as the DDR3 SDRAM Joint Electron Devices Engineering Council (JEDEC) Standard JESD79-3C, April 2008, the Low Power Double Data Rate (LPDDR) SDRAM JEDEC Standard JESD209B, February 2010, and/or the like.

Memory device 120 may be an integrated circuit package within a larger memory device (not shown) of system 100. For example, memory device 120 may be a DRAM device of a memory module such as a dual in-line memory module (DIMM). Memory device 120 may include memory resources 126, which represents one or more logical and/or physical groups of memory. In an embodiment, resources 126 includes storage elements arranged in an array of rows and columns.

During operation of system 100, memory controller 110 may—e.g. on behalf of a host 140 (e.g. one or more processors) of system 100—send commands or instructions to memory device 120 over command/address bus CA 134, which are then interpreted by memory device 120. Memory controller 110 and memory device 120 may variously exchange one or more other control signals to facilitate the communication of information via CA 134. By way of illustration and not limitation, a clock signal 130 may be sent to memory device 120 to determine at least in part a timing of information exchanges via CA 134. In an embodiment, clock signal 130 is one signal of a differential clock signal pair which, for example, memory controller 110 sends to, or otherwise shares with, memory device 120. Alternatively or in addition, a chip select signal 132 may be exchanged from memory controller 110 to memory device 120—e.g. where chip select signal 132 is to distinguish an exchange via CA 134 which is intended memory device 120 from some other exchange via CA 134 which is intended another memory device (not shown) of system 100. Any of a variety of additional or alternative control signals may be exchanged between memory device 110 and memory controller 120, according to different embodiments.

Memory device 120 may decode command information provided via CA 134 to perform a variety of access functions within the memory, and decode address information—e.g. with column logic and/or row logic of memory device 120. The logic may access a specific location in memory resources 126 with a combination of a column address strobe or signal (CAS) and a row address strobe or signal (RAS). Rows of memory resources 126 may be implemented in accordance with known memory architectures or their derivatives. Briefly, a row of memory may include one or more addressable columns of memory cells, as identified by the CAS generated by column logic 124. The rows may each be variously addressable via the RAS generated by row logic of memory device.

Memory device 120 may include command/address (C/A) logic 124 to facilitate, at least in part, processing of signals exchanged by CA 134. C/A logic 124 may include, or operate in conjunction with, logic of memory device 120 which processes command information and/or address information according to conventional techniques—e.g. where C/A logic 124 supplements such logic with additional functionality discussed herein. By way of illustration and not limitation, C/A logic 124 may detect a current operational mode of memory device 120—e.g. based on information stored in a mode register 122 of memory device 120. In an embodiment, mode register 122 may be configured at different times to variously specify any of two or more modes of operation. For example, mode register 122 may variously specify one of at least a first mode and a second mode, where the first mode is to implement a rate of exchanging communications via CA 134 which is slower than a similar rate implemented by the second mode. Based on information stored in mode register 122, for example, C/A logic 124 may perform sampling of CA 134 at a rate which corresponds to the current mode of memory device 120.

Memory controller 110 may include configuration logic 112 to facilitate, at least in part, a scheduling of communication via CA 134. Configuration logic 112 may include, or operate in conjunction with, logic of memory controller 110 which drives the transmission of signals to memory device 110 via CA 134. The driving of such transmission may be according to conventional techniques—e.g. where configuration logic 112 supplements such logic with additional functionality discussed herein. By way of illustration and not limitation, configuration logic 112 may detect a current operational mode of memory device 120 based on configuration logic 112 reading of information stored in mode register 122, or—alternatively—in conjunction with configuration logic 112 writing such information to mode register 122 (e.g. with a mode register set command).

In an embodiment, a scheduler 114 of memory controller 110 comprises logic to determine a scheduling of communications via CA 134. Based on configuration logic 112 detecting a mode of operation of memory device 120, configuration logic 112 may signal to scheduler 114 that a particular scheduling scheme is to be used for transmitting information via CA 134. For example, scheduler 114 may support one mode of memory device 120 with a first scheduling scheme in which a command is to be sent in portions via CA 134, where each transition in a sequence of transitions of clock signal 130 corresponds to a respective one of such portions. Alternatively or in addition, scheduler 114 may support another mode of memory device 120 with a second scheduling scheme in which a command is to be sent in portions via CA 134, where each Nth transition in a sequence of transitions of clock signal 130 (where N is an integer greater than 1) corresponds to a respective one of such portions.

Figure 2:
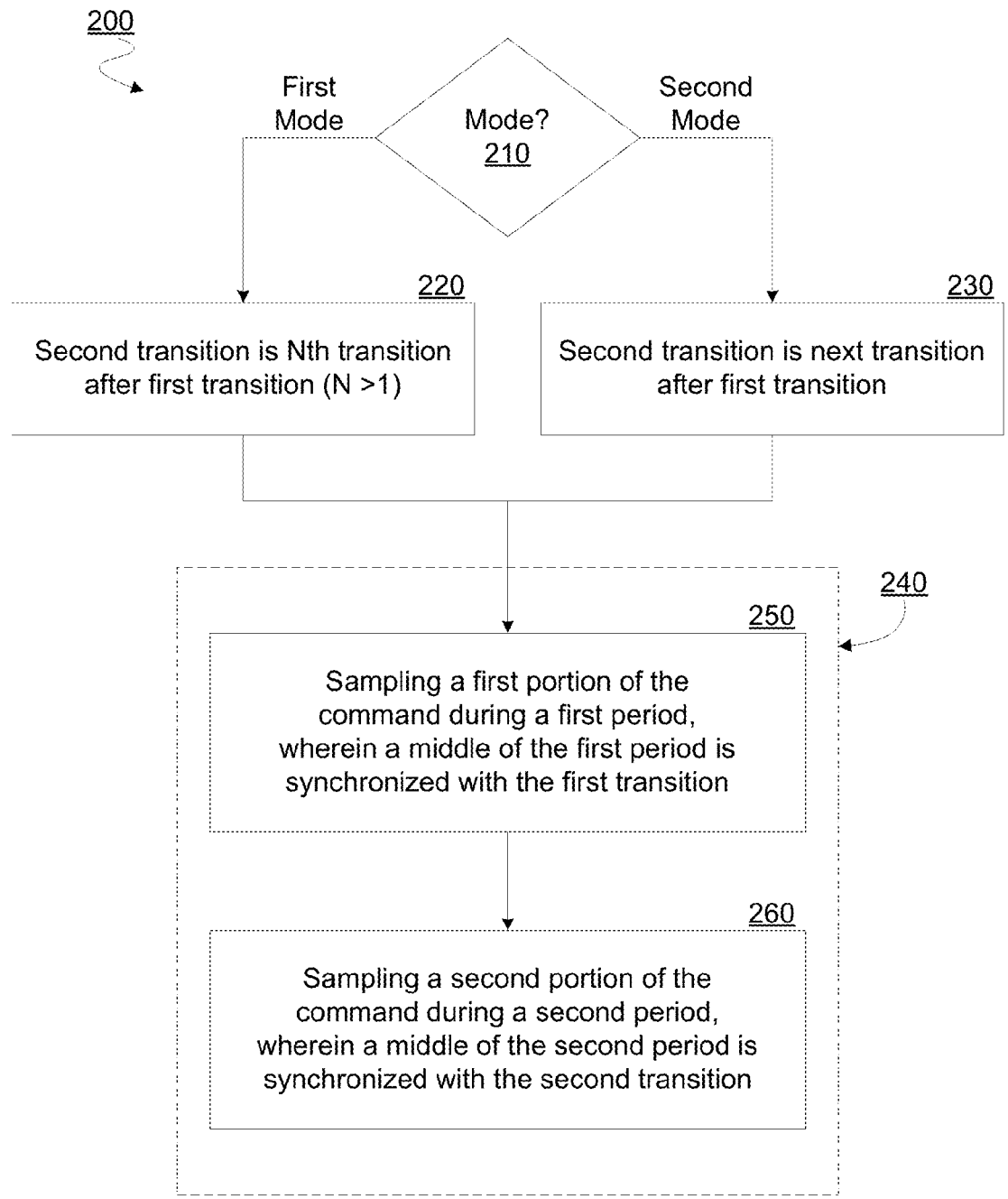
FIG. 2 is a flow diagram illustrating elements of a method for operating a memory device according to an embodiment.

FIG. 2 illustrates elements of a method 200 for operating a memory device according to an embodiment. Method 200 may be performed, for example, by a memory device having some or all of the features of memory device 120. For example, method 200 may be performed by a memory device operating in conjunction with a memory controller such as memory controller 110.

Method 200 may include, at 210, determining a mode of operation of the memory device—e.g. based on a mode register of the memory device. The mode determined at 210 may be determinative of a relationship between a first transition of a first clock signal and a second transition of the first clock signal. The first clock signal may be provided to the memory device to regulate exchanges—e.g. including command/address information exchanges and/or data exchanges—between the memory controller and the memory device.

If the mode determined at 210 is a first mode, then method 200 determines, at 220, that the second transition is to be an Nth transition of the first clock signal after the first transition, where N is an integer greater than one. In an embodiment, the first mode is a training mode for determining one or more signaling characteristics of the C/A bus coupled between the memory controller and the memory device. Alternatively or in addition, the first mode may be a default mode which, for example, the memory device is to automatically return to after an initialization event such as a RESET, a power down, a sleep mode or any of a variety of other such events.

Alternatively, if the mode determined at 210 is a second mode, then method 200 determines, at 230, that the second transition is a next transition of the first clock signal after the first transition. The second mode may be for higher speed communications which, for example, take place after completion of a command/address bus training sequence performed while the memory device is in the first mode.

Based on the mode determined at 210, method 200 may perform, at 240, sampling of a command which is provided by the memory controller to the memory device. In an embodiment the sampling at 240 includes, at 250, sampling a first portion of the command provided via a command/address bus during a first period, wherein a middle of the first period is synchronized with the first transition of the first clock signal. For example, the memory device may time the activation and subsequent deactivation of sampling circuitry so that a middle of a first sampling period is concurrent with the first transition. Alternatively of in addition, the middle of such a sampling period may, for example, coincide with the middle of a period when a value of a chip select signal is asserted by the memory controller to enable operation of the memory device. Any of variety of conventional bus sampling circuit architectures may be adapted to work with sample control logic of various embodiments to implement such sampling periods.

The sampling at 240 may further include, at 260, sampling a second portion of the command provided via the command/ address bus during a second period, wherein a middle of the second period is synchronized with the second transition of the first clock signal. For example, similar to the sampling at 250, the memory device may time another activation and subsequent deactivation of sampling circuitry so that a middle of a second sampling period is concurrent with the second transition. In an embodiment, the chip select signal value asserted during the first period may not be asserted during the second period. For example, the memory device may be configured to recognize that, subsequent to a chip select signal which indicates operation of the memory device, a predetermined number of C/A bus exchanges thereafter are intended for that memory device.

Figure 3:
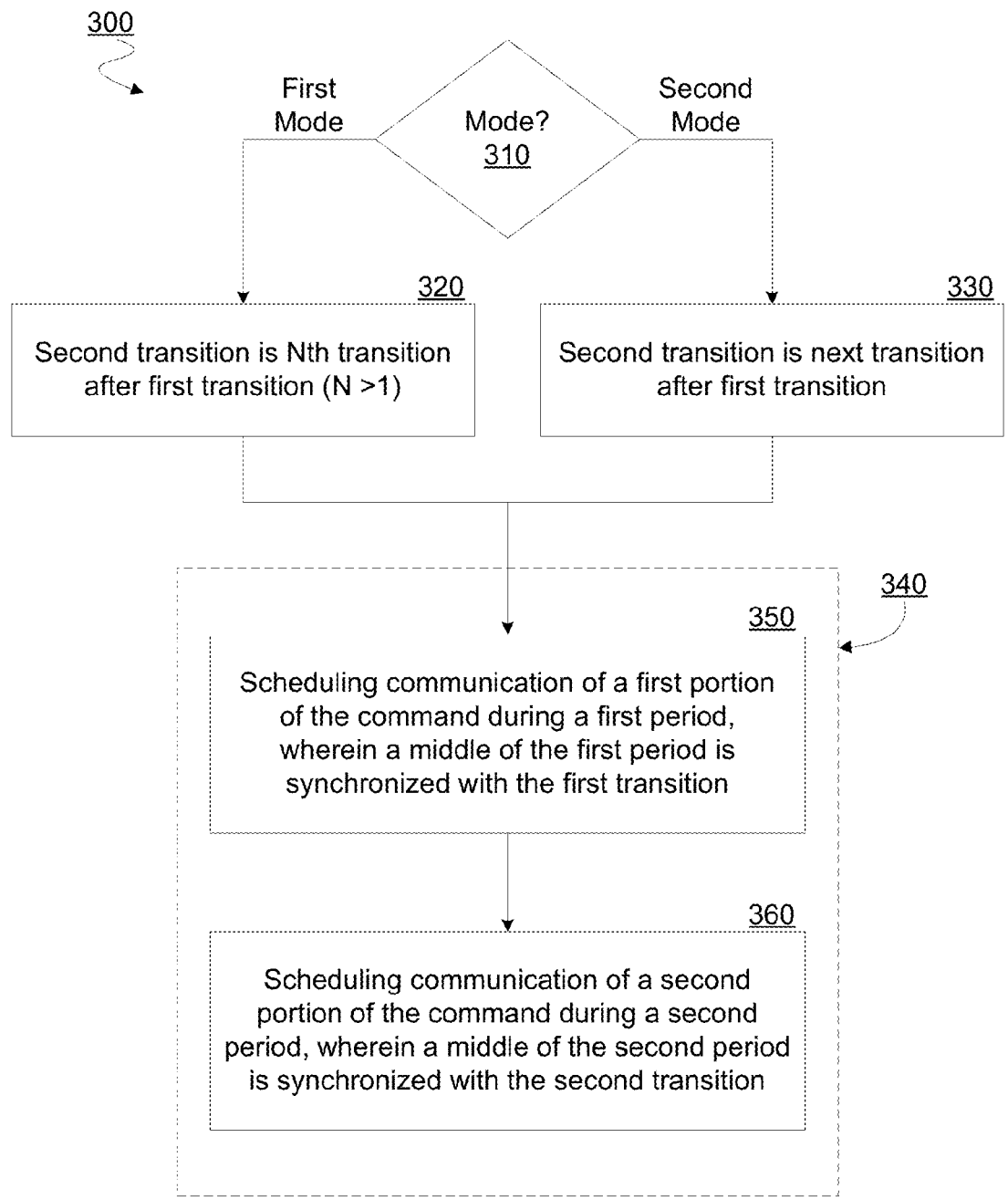
FIG. 3 is a flow diagram illustrating elements of a method for operating a memory controller according to an embodiment.

FIG. 3 illustrates elements of a method 300 for controlling a memory device with a memory controller according to an embodiment. In an embodiment, method 300 is performed by a memory controller having some or all of the features of memory controller 110. For example, method 300 may be performed by a memory controller operating in conjunction with a memory device such as memory device 120.

Method 300 may include, at 310, determining a mode of operation of the memory device—e.g. including accessing a mode register of the memory device. As with method 200, the mode determined at 310 may be determinative of a relationship between a first transition of a first clock signal and a second transition of the first clock signal. The first clock signal may be provided to the memory device to regulate exchanges—e.g. including command/address information exchanges and/or data exchanges—between the memory controller and the memory device.

If the mode determined at 310 is a first mode, then method 300 determines, at 320, that the second transition is to be an Nth transition of the first clock signal after the first transition, where N is an integer greater than one. In an embodiment, the first mode is a training mode for determining one or more signaling characteristics of the C/A bus coupled between the memory controller and the memory device. Alternatively or in addition, the first mode may be a default mode which, for example, the memory device is to automatically return to after an initialization event such as a RESET, a power down, a sleep mode or any of a variety of other such events. Alternatively, if the mode determined at 310 is a second mode, then method 300 determines, at 330, that the second transition is a next transition of the first clock signal after the first transition. The second mode may be for higher speed communications which, for example, take place after a command/address bus training sequence is completed.

Based on the mode determined at 310, method 300 may perform, at 340, scheduling communication of a command to the memory. In an embodiment the scheduling at 340 includes, at 350, scheduling communication of a first portion of the command to take place via a command/address bus during a first period, wherein a middle of the first period is synchronized with the first transition of the first clock signal. For example, the memory controller may schedule the activation and subsequent deactivation of C/A bus driver circuitry so that a middle of a first signaling period is concurrent with the first transition. Alternatively of in addition, the middle of such a signaling period may, for example, coincide with the middle of a period when a value of a chip select signal is asserted by the memory controller to enable operation of the memory device.

The sampling at 340 may further include, at 360, scheduling communication of a second portion of the command to take place via the command/address bus during a second period, wherein a middle of the second period is synchronized with the second transition of the first clock signal. For example, similar to the sampling at 350, the memory device may time another activation and subsequent deactivation of C/A bus driver circuitry so that a middle of a second signaling period is concurrent with the second transition. As discussed herein, the chip select signal value asserted during the first period may not be asserted during the second period, in an embodiment.

Figure 4:
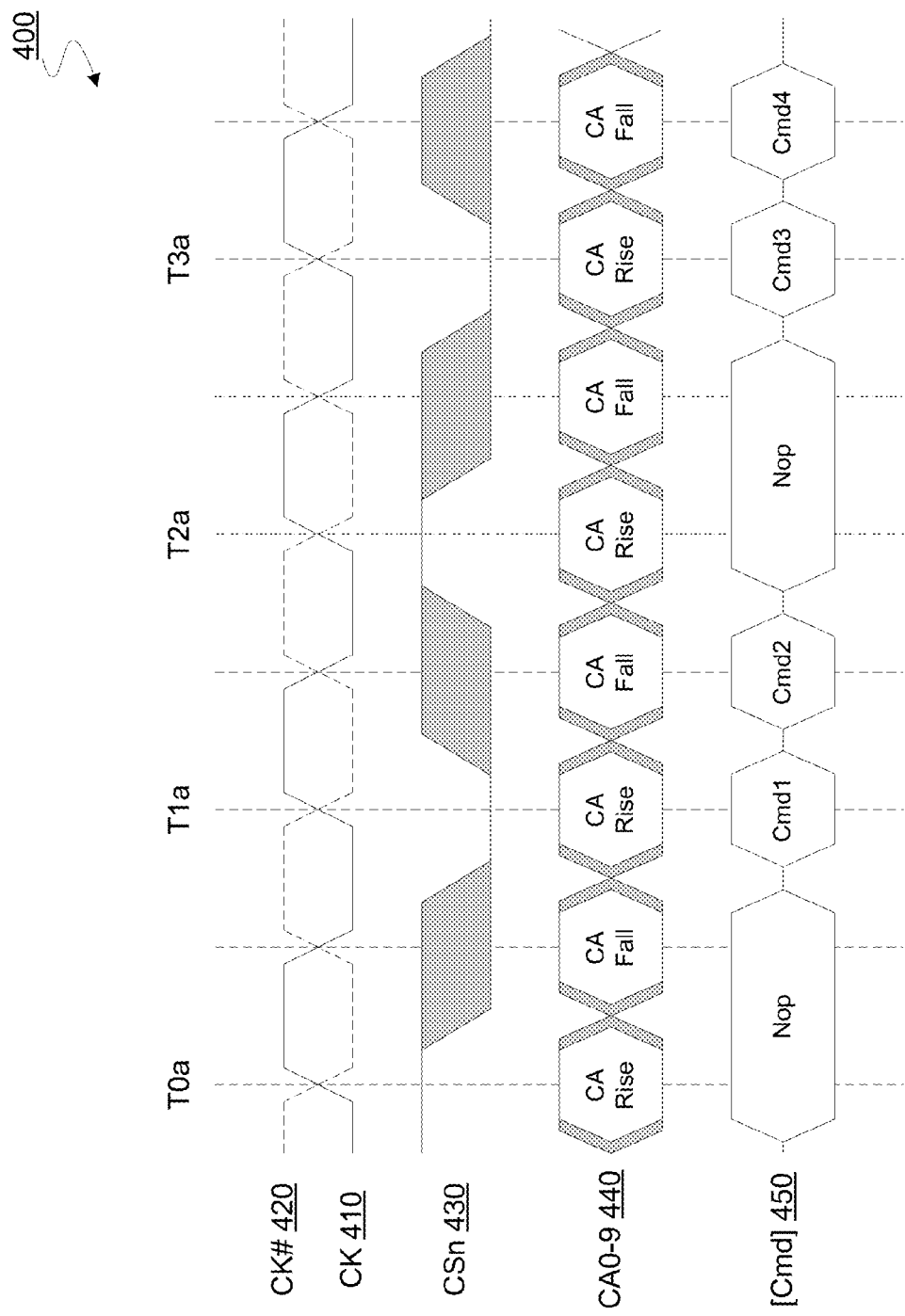
FIG. 4 is a timing diagram illustrating elements of an exchange of command/address bus communications according to an embodiment.

FIG. 4 is a timing diagram 400 illustrating elements of an exchange of signals, according to an embodiment, between a memory controller and a memory device. The illustrative exchange of signals may be implemented, for example, by memory controller 110 and memory device 120. In an embodiment, such an exchange takes place while the memory device operates in a mode such as the second mode of method 200 and/or the second mode of method 300.

Timing diagram 400 shows a clock signal differential pair including clock signal CK 410 and a complementary signal CK# 420, which the memory device receives, for example, from the memory controller. A chip select signal CSn 430 of timing diagram 400 may be used by the memory controller to specify to the memory device when the memory device is the target of an associated communication of signals on a command/address bus. In this example, CSn 430 is an active low signal. Signal lines of the command/address bus—e.g. the illustrative lines CA0-9 440 of timing diagram 400—may variously carry command information and/or address information to the memory device. Timing diagram 400 further shows [Cmd] 450, which represents particular commands, or portions of commands, which are being communicated via CA0-9 440.

In an illustrative scenario according to an embodiment, the memory device participating in the exchange of timing diagram 400 is configured to implement a sampling scheme in which portions of a given command are each to be sampled from CA0-9 440, where each transition in a sequence of transitions of clock signal 410 (or similarly, of CK# 420) corresponds to a respective sampling of one such portion of the command. For example, a first command may be transmitted from the memory controller via CA0-9 440 in two successive portions Cmd1, Cmd2. The current mode of the memory device may determine that the memory device is to sample an earliest portion of a given command during a particular type of transition of a particular clock signal—e.g. a rising transition CK 410. Samplings of CA0-9 440 which take place on such a rising clock transition of CK 410 are labeled CA Rise in CA0-9 440. Samplings of CA0-9 440 which take place on falling clock transition of CK 410 are labeled CA Fall in CA0-9 440. The asserting of CSn 430 prior to a particular rising transition of CK 410—e.g. the transition at time T1a—will indicate to the memory device that an earliest command portion Cmd1 of a command is to be sampled during that rising transition.

The current mode of the memory device may further determine that each successive transition of the clock signal is to coincide with a sampling of another portion of the given command until all portions of the command have been sampled. In the illustrative exchange of timing diagram 400, only one other portion Cmd2 of the command is to be sampled—e.g. during the next transition of CK 410 (the falling transition which is immediately subsequent to the rising transition of CK 410 at time T1a). In an embodiment, the memory controller may assert CSn 430 concurrent with sending a first portion of a command, such as Cmd1, without also asserting CSn 430 during sending of another portion of that command, such as Cmd2. The memory device may be configured—e.g. based on the current mode—to interpret the assertion of CSn 430 for the first command portion as indicating that selection of the memory device is to apply for a predetermined total number of portions of the command.

Where all portions of a command have been sampled, and where CSn 430 is not asserted in time for a next rising transition of CK 410 (or some other predefined type of clock signal transition), the memory device may consider that next rising transition of CK 410 to be concurrent with a No Operation (Nop) exchange or a command exchange which is targeted to another memory device. An example of such a Nop exchange is shown for the transition of CK 410 at time T2a.

After such a Nop exchange, the memory controller may, for example, send a second command to the memory device. For example, CSn 430 may be asserted prior to a rising transition of CK 410 at time T3a to indicate to the memory device that an earliest command portion Cmd3 of the second command is to be sampled at during that rising transition. Based on the current mode of the memory device, a next portion Cmd4 of the second command may be sampled on the next transition of CK 410, which in this example is the falling transition immediately subsequent to the rising transition of CK 410 at time T3a.

Figure 5:
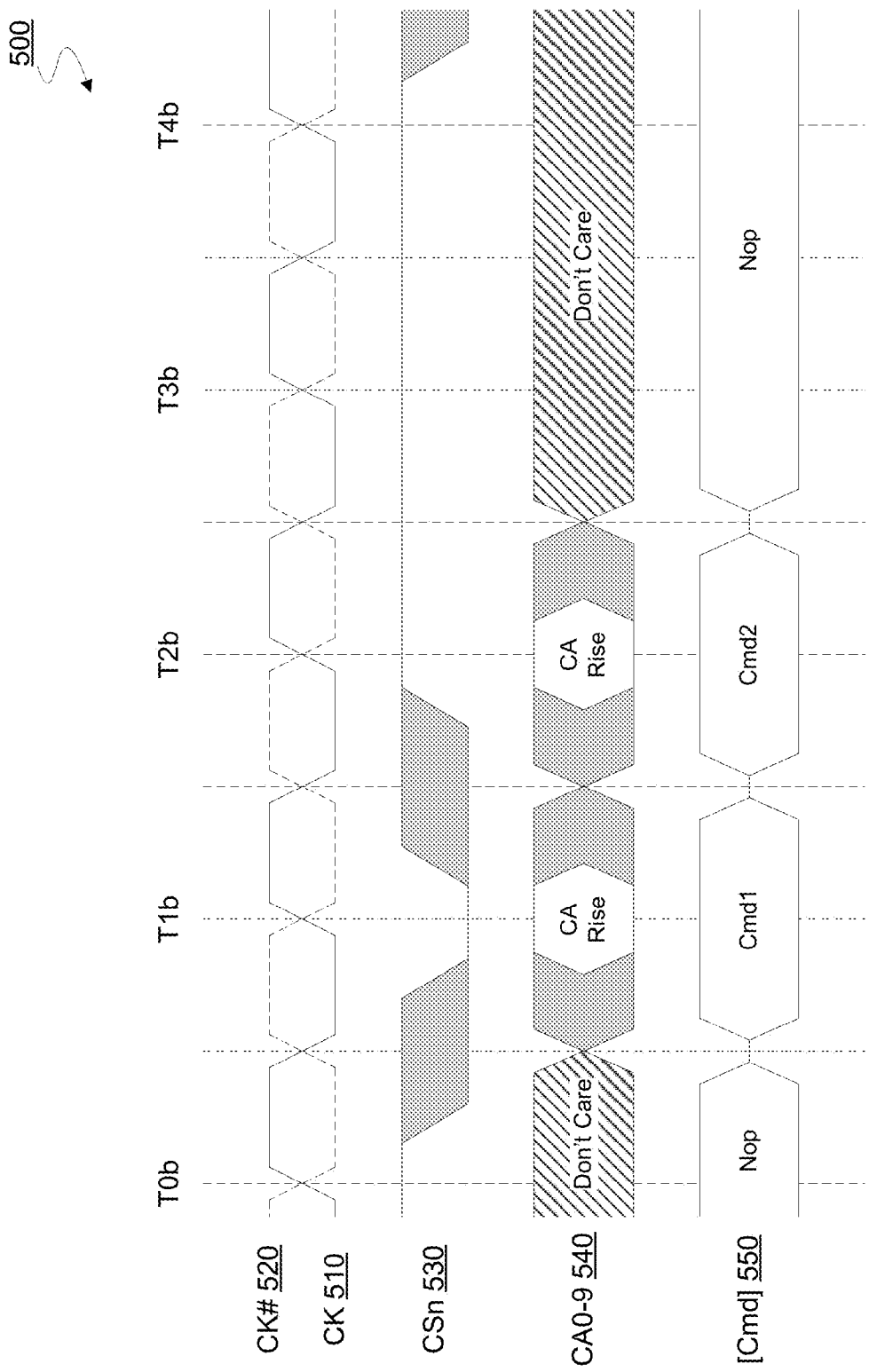
FIG. 5 is a timing diagram illustrating elements of an exchange of command/address bus communications according to an embodiment.

FIG. 5 is a timing diagram 500 illustrating elements of an exchange of signals, according to an embodiment, between a memory controller and a memory device. The exchange of timing diagram 500 may be implemented, for example, by the memory controller and memory device which, at another time, participate in the exchange of timing diagram 400, for example. In an embodiment, such an exchange takes place while the memory device operates in a mode such as the first mode of method 200 and/or the first mode of method 300.

Timing diagram 500 shows a clock signal differential pair including clock signal CK 510 and a complementary signal CK# 520, chip select signal CSn 530, command/address bus signal lines CA0-9 540 and [Cmd] 550. In an embodiment, CK 510, CK# 520, CSn 530, CA0-9 540 and [Cmd] 550 correspond, respectively, to CK 410, CK# 420, CSn 430, CA0-9 440 and [Cmd] 450 of timing diagram 400.

In an illustrative scenario according to an embodiment, the memory device participating in the exchange of timing diagram 500 is configured to implement a sampling scheme in which portions of a given command are each to be sampled from CA0-9 540, where each Nth transition in a sequence of transitions of clock signal 510 (or similarly, of CK# 520) corresponds to a respective sampling of one of such portions. In an embodiment, N is an integer greater than one (1). In the example illustrated in timing diagram 500, N is equal to two (2). However, N may be any of various other numbers—e.g. four (4)—according to different embodiments.

For example, a first command may be transmitted from the memory controller via CA0-9 540 in two successive portions Cmd1, Cmd2. The current mode of the memory device may determine that the memory device is to sample an earliest portion of a given command on a particular type of transition of a particular clock signal—e.g. a rising transition of CK 510. The asserting of CSn 530 prior to a particular rising transition of CK 510—e.g. the transition at time T1b—will indicate to the memory device that an earliest command portion Cmd1 of a command is to be sampled during that rising transition.

The current mode of the memory device may further determine that each Nth successive transition of CK 510 subsequent to that at T1b is coincide with a sampling of another portion of the given command until all portions of the command have been sampled. In the illustrative exchange of timing diagram 500, only one other portion Cmd2 of the command is to be sampled—e.g. during the second next transition of CK 510 (the next rising transition at time T2b which is subsequent to the rising transition of CK 510 at time T1b).

Where all portions of a command have been sampled, and where CSn 530 is not asserted in time for a next rising transition of CK 510 (or some other agreed upon type of clock signal transition), the memory device may consider that next rising transition of CK 510 to be a concurrent with a Don't Care event—e.g. a Nop exchange or a command exchange which is targeted to another memory device. An example of such a Don't Care event is shown for the positive transition of CK 510 at time T3b.

By requiring that a command address bus exchange successive portions of a command during every Nth transition of CK 510, the memory device mode illustrated in timing diagram 500 allows for longer sampling periods. Accordingly, certain types of command/address bus exchanges—e.g. exchanges to implement command/address bus training— may be performed without limiting the frequency a data clock signal. The memory device may transition into such a mode when one or more such exchanges are to be performed and/or transition from such a mode in response to detecting that one or more such exchanges have completed.

Figure 6:
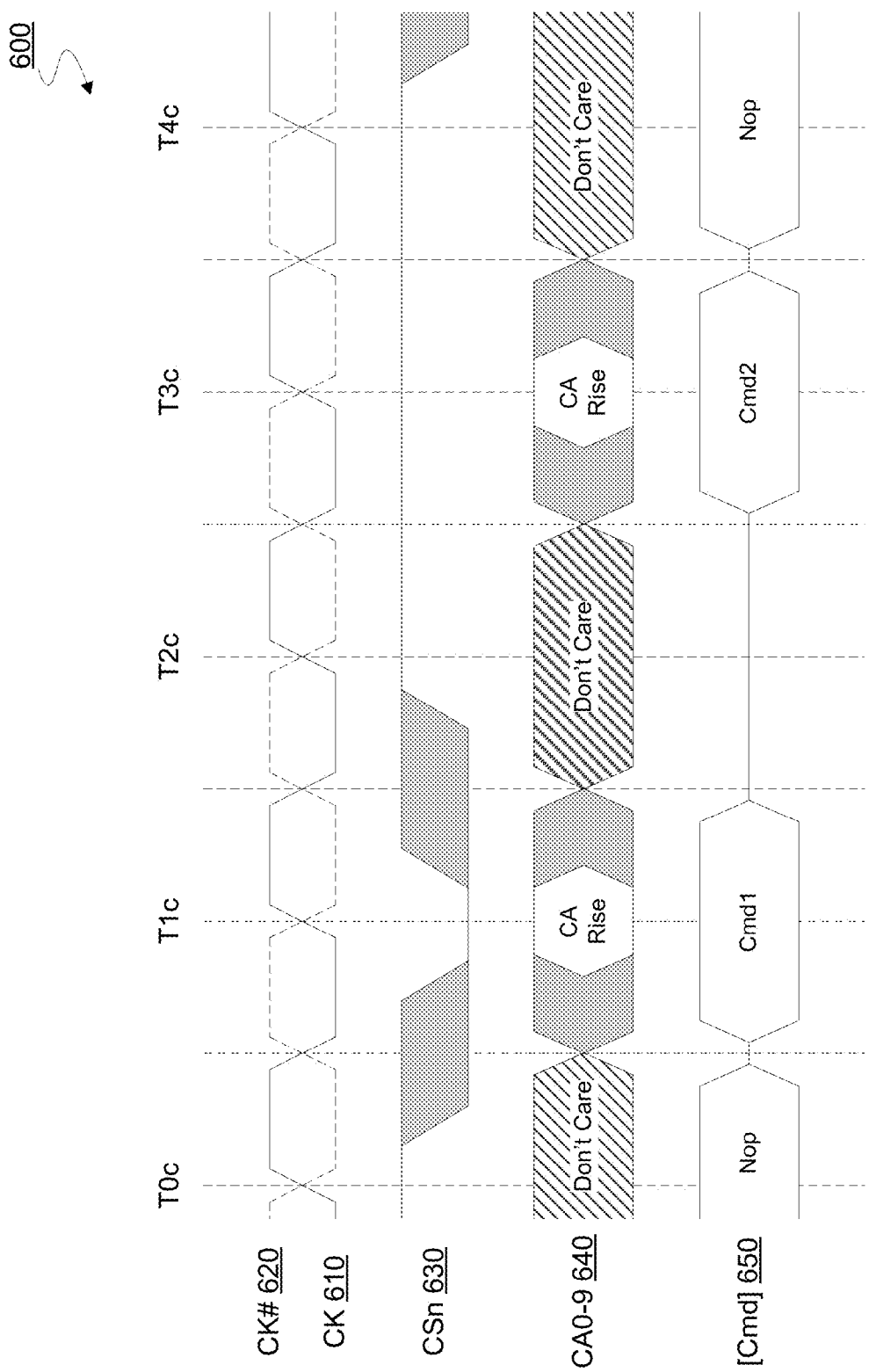
FIG. 6 is a timing diagram illustrating elements of an exchange of command/address bus communications according to an embodiment.

FIG. 6 is a timing diagram 600 illustrating elements of an exchange of signals, according to an embodiment, between a memory controller and a memory device. The exchange of timing diagram 600 may be implemented, for example, by the memory controller and memory device which, at another time, participate in the exchange of timing diagram 400, for example. In an embodiment, such an exchange takes place while the memory device operates in a mode such as the first mode of method 200 and/or the first mode of method 300.

Timing diagram 600 illustrates an alternate version of the mode shown in timing diagram 500, where N is equal to four (4) rather than two (2). Timing diagram 600 shows a clock signal differential pair including clock signal CK 610 and a complementary signal CK# 620, chip select signal CSn 630, command/address bus signal lines CA0-9 640 and [Cmd] 650. In an embodiment, CK 610, CK# 620, CSn 630, CA0-9 640 and [Cmd] 650 correspond, respectively, to CK 410, CK# 420, CSn 430, CA0-9 440 and [Cmd] 450 of timing diagram 400.

In an illustrative scenario according to an embodiment, a first command may be transmitted from the memory controller via CA0-9 640 in two successive portions Cmd1, Cmd2. The current mode of the memory device may determine that the memory device is to sample an earliest portion of a given command during a particular type of transition of a particular clock signal—e.g. a rising transition CK 610. The asserting of CSn 630 prior to a particular rising transition of CK 610—e.g. the transition at time T1c—will indicate to the memory device that an earliest command portion Cmd1 of a command is to be sampled at during that rising transition.

The current mode of the memory device may further determine that each Nth (in this example, fourth) successive transition of CK 610 subsequent to that at T1b is coincide with a sampling of another portion of the given command until all portions of the command have been sampled. In the illustrative exchange of timing diagram 600, only one other portion Cmd2 of the command is to be sampled—e.g. on the fourth next transition of CK 610 (the second next rising transition, at time T3c, which is subsequent to the rising transition of CK 610 at time T1c). In an embodiment, the memory device may be configured—e.g. based on the current mode—to treat as a Don't Care event the state of CA0-9 640 between the respective exchanges of Cmd1 and Cmd2.

Figure 7:
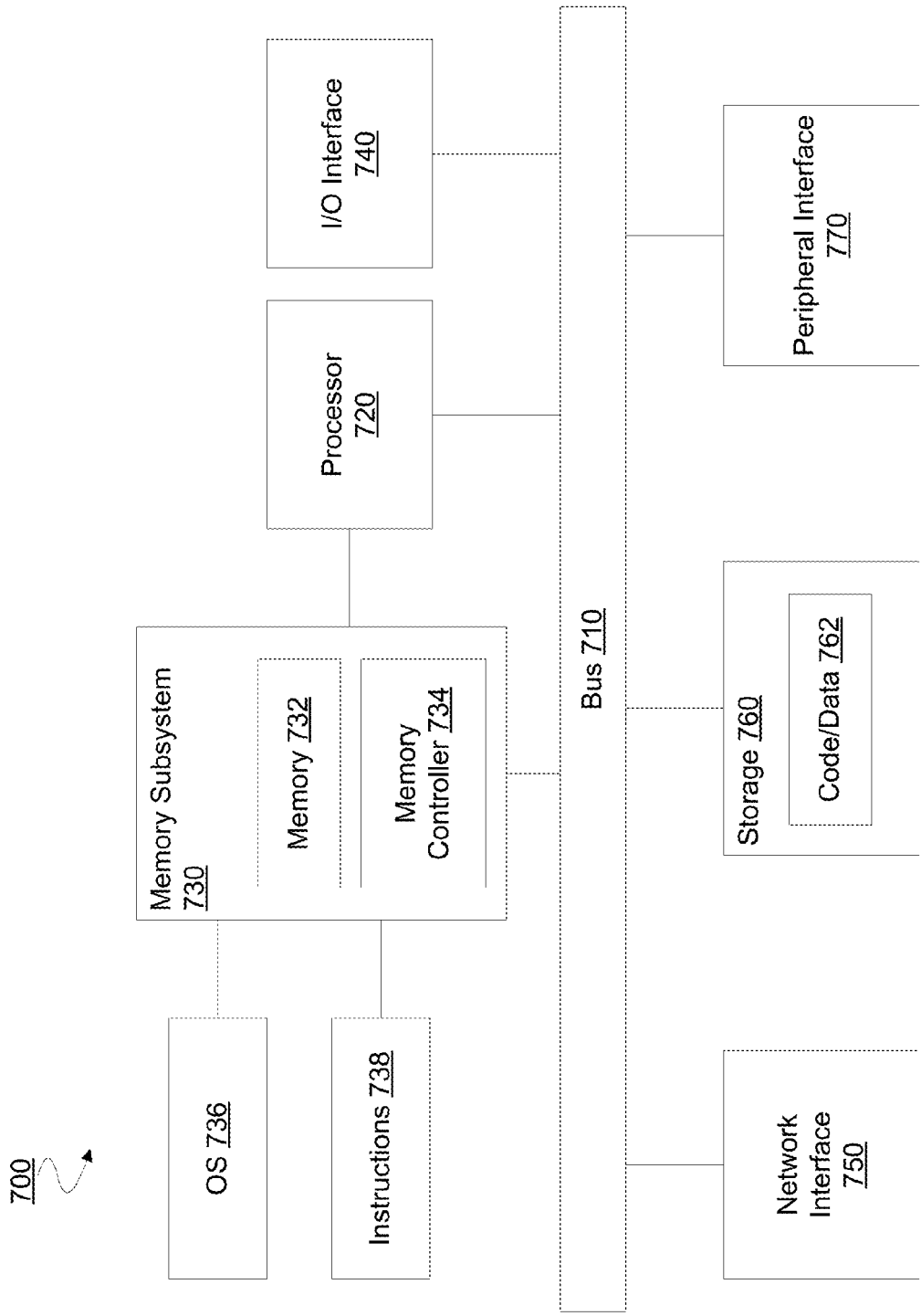
FIG. 7 is a block diagram illustrating elements of a computing system for exchanging communications according to an embodiment.

FIG. 7 is a block diagram of an embodiment of a computing system in which command/address bus communications may be implemented. System 700 represents a computing device in accordance with any embodiment described herein, and may be a laptop computer, a desktop computer, a server, a gaming or entertainment control system, a scanner, copier, printer, or other electronic device. System 700 may include processor 720, which provides processing, operation management, and execution of instructions for system 700. Processor 720 may include any type of microprocessor, central processing unit (CPU), processing core, or other processing hardware to provide processing for system 700. Processor 720 controls the overall operation of system 700, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 730 represents the main memory of system 700, and provides temporary storage for code to be executed by processor 720, or data values to be used in executing a routine. Memory subsystem 730 may include one or more memory devices such as read-only memory (ROM), flash memory, one or more varieties of random access memory (RAM), or other memory devices, or a combination of such devices. Memory subsystem 730 stores and hosts, among other things, operating system (OS) 736 to provide a software platform for execution of instructions in system 700. Additionally, other instructions 738 are stored and executed from memory subsystem 730 to provide the logic and the processing of system 700. OS 736 and instructions 738 are executed by processor 720.

Memory subsystem 730 may include memory device 732 where it stores data, instructions, programs, or other items. In one embodiment, memory subsystem includes memory controller 734, which is a memory controller in accordance with any embodiment described herein, and which provides row hammer protection mechanisms. In one embodiment, memory controller 734 provides commands to memory device 732, where portions of the command are sent each sent in succession based on a current mode of memory device 732.

Processor 720 and memory subsystem 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 may include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 710 may also correspond to interfaces in network interface 750.

System 700 may also include one or more input/output (I/O) interface(s) 740, network interface 750, one or more internal mass storage device(s) 760, and peripheral interface 770 coupled to bus 710. I/O interface 740 may include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 may include an Ethernet adapter, wireless interconnection components, USB (universal serial bus), or other wired or wireless standards-based or proprietary interfaces.

Storage 760 may be or include any conventional medium for storing large amounts of data in a nonvolatile manner, such as one or more magnetic, solid state, or optical based disks, or a combination. Storage 760 holds code or instructions and data 762 in a persistent state (i.e., the value is retained despite interruption of power to system 700). Storage 760 may be generically considered to be a "memory," although memory 730 is the executing or operating memory to provide instructions to processor 720. Whereas storage 760 is nonvolatile, memory 730 may include volatile memory (i.e., the value or state of the data is indeterminate if power is interrupted to system 700).

Peripheral interface 770 may include any hardware interface not specifically mentioned above. Peripherals refer generally to devices that connect dependently to system 700. A dependent connection is one where system 700 provides the software and/or hardware platform on which operation executes, and with which a user interacts.

Figure 8:
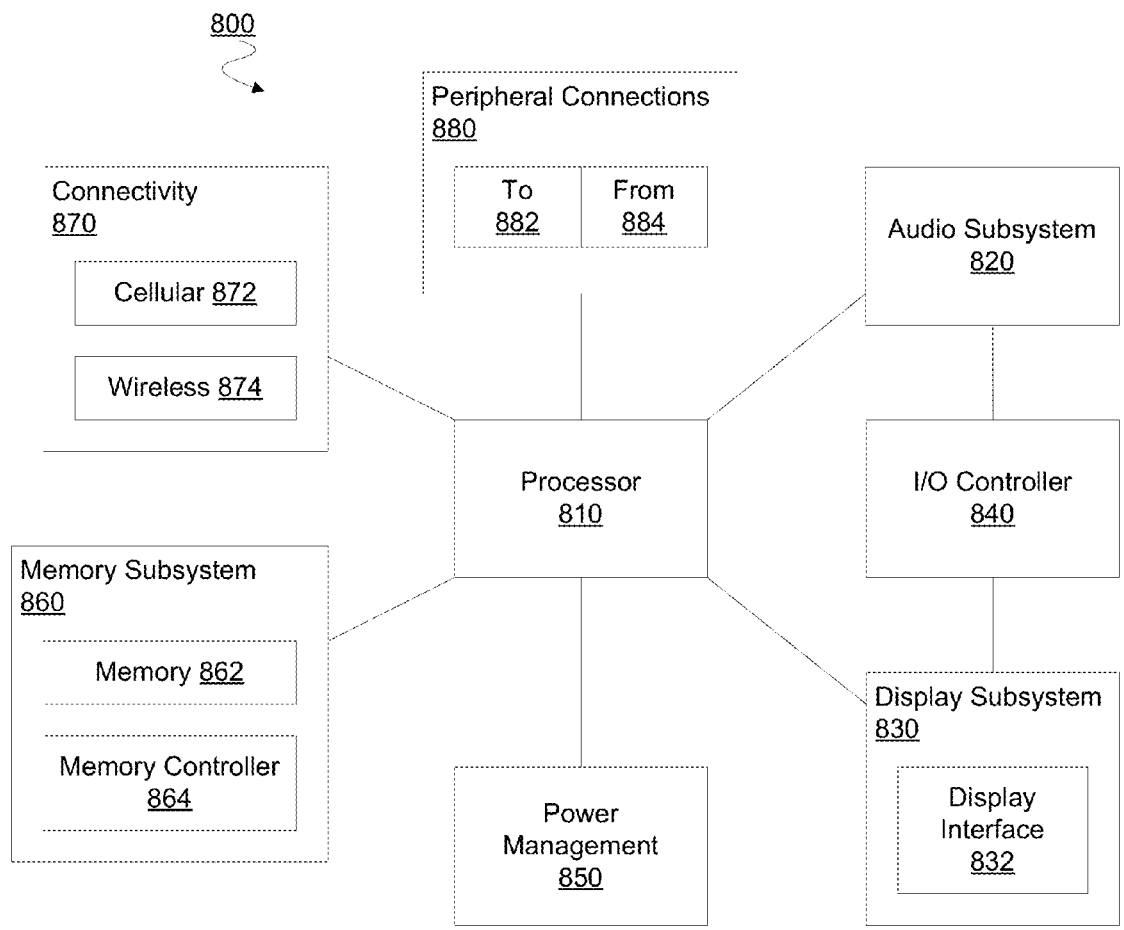
FIG. 8 is a block diagram illustrating elements of a mobile device for exchanging communications according to an embodiment.

FIG. 8 is a block diagram of an embodiment of a mobile device in which command/address communications may be implemented. Device 800 represents a mobile computing device, such as a computing tablet, a mobile phone or smartphone, a wireless-enabled e-reader, or other mobile device. It will be understood that certain of the components are shown generally, and not all components of such a device are shown in device 800.

Device 800 may include processor 810, which performs the primary processing operations of device 800. Processor 810 may include one or more physical devices, such as microprocessors, application processors, microcontrollers, programmable logic devices, or other processing means. The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations may also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 may include display interface 832, which may include the particular screen or hardware device used to provide a display to a user. In one embodiment, display interface 832 includes logic separate from processor 810 to perform at least some processing related to the display. In one embodiment, display subsystem 830 includes a touchscreen device that provides both output and input to a user.

I/O controller 840 represents hardware devices and software components related to interaction with a user. I/O controller 840 may operate to manage hardware that is part of audio subsystem 820 and/or display subsystem 830. Additionally, I/O controller 840 illustrates a connection point for additional devices that connect to device 800 through which a user might interact with the system. For example, devices that may be attached to device 800 might include microphone devices, speaker or stereo systems, video systems or other display device, keyboard or keypad devices, or other I/O devices for use with specific applications such as card readers or other devices.

As mentioned above, I/O controller 840 may interact with audio subsystem 820 and/or display subsystem 830. For example, input through a microphone or other audio device may provide input or commands for one or more applications or functions of device 800. Additionally, audio output may be provided instead of or in addition to display output. In another example, if display subsystem includes a touchscreen, the display device also acts as an input device, which may be at least partially managed by I/O controller 840. There may also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that may be included in device 800. The input may be part of direct user interaction, as well as providing environmental input to the system to influence its operations (such as filtering for noise, adjusting displays for brightness detection, applying a flash for a camera, or other features).

In one embodiment, device 800 includes power management 850 that manages battery power usage, charging of the battery, and features related to power saving operation. Memory subsystem 860 may include memory device(s) 862 for storing information in device 800. Memory subsystem 860 may include nonvolatile (state does not change if power to the memory device is interrupted) and/or volatile (state is indeterminate if power to the memory device is interrupted) memory devices. Memory 860 may store application data, user data, music, photos, documents, or other data, as well as system data (whether long-term or temporary) related to the execution of the applications and functions of system 800.

In one embodiment, memory subsystem 860 includes memory controller 864 (which could also be considered part of the control of system 800, and could potentially be considered part of processor 810). Memory controller 864 may exchange communications with memory 862 via a command/address bus (not shown). In an embodiment, memory controller 864 sends a command to memory 862, where portions of the command are sent in succession based on an operating mode of memory 862.

Connectivity 870 may include hardware devices (e.g., wireless and/or wired connectors and communication hardware) and software components (e.g., drivers, protocol stacks) to enable device 800 to communicate with external devices. The device could be separate devices, such as other computing devices, wireless access points or base stations, as well as peripherals such as headsets, printers, or other devices.

Connectivity 870 may include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector may allow device 800 to connect to certain peripherals that allow device 800 to control content output, for example, to audiovisual or other systems.

In addition to a proprietary docking connector or other proprietary connection hardware, device 800 may make peripheral connections 880 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one aspect, a memory device comprises a mode register to store a value identifying a mode of operation of the memory device, and command/address (CA) logic to determine the mode based on the value and, based on the mode, to sample a command provided by a memory controller coupled to the memory device. The CA logic is to sample a first portion of the command provided via a command/address bus during a first period, wherein a middle of the first period is synchronized with a first transition of a first clock signal provided by the memory controller. The CA logic is further to sample a second portion of the command provided via the command/address bus during a second period, wherein a middle of the second period is synchronized with a second transition of the first clock signal, wherein if the determined mode is a first mode, then the second transition is an Nth transition of the first clock signal after the first transition, wherein N is an integer greater than one, and if the determined mode is a second mode, the second transition is a next transition of the first clock signal after the first transition.

In an embodiment, N is equal to 2 or 4. In another embodiment, the command is for a command/address bus training sequence. In another embodiment, the first mode is a default mode. In another embodiment, the memory device is to automatically return to the first mode in response to an initialization event. In another embodiment, the initialization event includes a transition of the memory device from a first power state to a second power, wherein a level of power consumption of the first power state is greater than a level of power consumption of the second power state. In another embodiment, the first clock signal is a data clock signal. In another embodiment, a differential signal pair includes the first clock signal and a second clock signal. In another embodiment, the memory device includes a dynamic random access memory.

In another aspect, a method at a memory device comprises determining a mode of operation based on a mode register of the memory device, and based on the determined mode, sampling a command provided by a memory controller coupled to the memory device, including sampling a first portion of the command provided via a command/address bus during a first period, wherein a middle of the first period is synchronized with a first transition of a first clock signal provided by the memory controller, and sampling a second portion of the command provided via the command/address bus during a second period, wherein a middle of the second period is synchronized with a second transition of the first clock signal. If the determined mode is a first mode, then the second transition is an Nth transition of the first clock signal after the first transition, wherein N is an integer greater than one, and if the determined mode is a second mode, the second transition is a next transition of the first clock signal after the first transition.

In an embodiment, N is equal to 2 or 4. In another embodiment, the command is for a command/address bus training sequence. In another embodiment, the first mode is a default mode. In another embodiment, the memory device is to automatically return to the first mode in response to an initialization event. In another embodiment, the initialization event includes a transition of the memory device from a first power state to a second power, wherein a level of power consumption of the first power state is greater than a level of power consumption of the second power state. In another embodiment, the first clock signal is a data clock signal. In another embodiment, a differential signal pair includes the first clock signal and a second clock signal. In another embodiment, the memory device includes a dynamic random access memory.

In another aspect, a memory controller comprises configuration logic to determine a mode of operation of a memory device coupled to the memory controller and scheduler logic to schedule communication of a command to the memory device based on the determined mode. The scheduler logic is to schedule communication of a first portion of the command via a command/address bus for a first period, wherein a middle of the first period is synchronized with a first transition of a first clock signal provided by the memory controller to the memory device. The scheduler logic is further to schedule communication of a second portion of the command via the command/address bus for a second period, wherein a middle of the second period is synchronized with a second transition of the first clock signal, wherein if the determined mode is a first mode, then the second transition is an Nth transition of the first clock signal after the first transition, wherein N is an integer greater than one, and if the determined mode is a second mode, the second transition is a next transition of the first clock signal after the first transition.

In an embodiment, N is equal to 2 or 4. In another embodiment, the command is for a command/address bus training sequence. In another embodiment, the first clock signal is a data clock signal. In another embodiment, a differential signal pair includes the first clock signal and a second clock signal. In another embodiment, the memory device includes a dynamic random access memory.

In another aspect, a method at a memory controller comprises determining a mode of operation of a memory device coupled to the memory controller and scheduling communication of a command to the memory device based on the determined mode, including scheduling communication of a first portion of the command via a command/address bus for a first period, wherein a middle of the first period is synchronized with a first transition of a first clock signal provided by the memory controller to the memory device, and scheduling communication of a second portion of the command via the command/address bus for a second period, wherein a middle of the second period is synchronized with a second transition of the first clock signal. If the determined mode is a first mode, then the second transition is an Nth transition of the first clock signal after the first transition, wherein N is an integer greater than one, and if the determined mode is a second mode, the second transition is a next transition of the first clock signal after the first transition.

In an embodiment, N is equal to 2 or 4. In another embodiment, the command is for a command/address bus training sequence. In another embodiment, the first clock signal is a data clock signal. In another embodiment, a differential signal pair includes the first clock signal and a second clock signal. In another embodiment, the memory device includes a dynamic random access memory.

Techniques and architectures for exchanging communications with a memory device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A memory device comprising:
   a mode register to store a value identifying a mode of operation of the memory device; and
   command/address (CA) logic to determine the mode based on the value and, based on the mode, to sample a command provided by a memory controller coupled to the memory device, including:
      the CA logic to sample a first portion of the command provided via a command/address bus during a first period, wherein a middle of the first period is synchronized with a first transition of a first clock signal provided by the memory controller; and
      the CA logic to sample a second portion of the command provided via the command/address bus during a second period, wherein a middle of the second period is synchronized with a second transition of the first clock signal;
   wherein if the determined mode is a first mode, then the second transition is an Nth transition of the first clock signal after the first transition, wherein N is an integer greater than one, and if the determined mode is a second mode, the second transition is a next transition of the first clock signal after the first transition.

2. The memory device of claim 1, wherein N is equal to 2 or 4.

3. The memory device of claim 1, wherein the command is for a command/address bus training sequence.

4. The memory device of claim 1, wherein the first mode is a default mode.

5. The memory device of claim 4, wherein the memory device is to automatically return to the first mode in response to an initialization event.

6. The memory device of claim 5, wherein the initialization event includes a transition of the memory device from a first power state to a second power, wherein a level of power consumption of the first power state is greater than a level of power consumption of the second power state.

7. The memory device of claim 1, wherein the first clock signal is a data clock signal.

8. The memory device of claim 1, a differential signal pair includes the first clock signal and a second clock signal.

9. The memory device of claim 1, wherein the memory device includes a dynamic random access memory.

10. A method at a memory device, the method comprising:
    determining a mode of operation based on a mode register of the memory device; and
    based on the determined mode, sampling a command provided by a memory controller coupled to the memory device, including:
       sampling a first portion of the command provided via a command/address bus during a first period, wherein a middle of the first period is synchronized with a first transition of a first clock signal provided by the memory controller; and
       sampling a second portion of the command provided via the command/address bus during a second period, wherein a middle of the second period is synchronized with a second transition of the first clock signal;
    wherein if the determined mode is a first mode, then the second transition is an Nth transition of the first clock signal after the first transition, wherein N is an integer greater than one, and if the determined mode is a second mode, the second transition is a next transition of the first clock signal after the first transition.

11. The method of claim 10, wherein N is equal to 2 or 4.

12. The method of claim 10, wherein the command is for a command/address bus training sequence.

13. The method of claim 10, wherein the first mode is a default mode.

14. The method of claim 13, wherein the memory device is to automatically return to the first mode in response to an initialization event.

15. The method of claim 14, wherein the initialization event includes a transition of the memory device from a first power state to a second power, wherein a level of power consumption of the first power state is greater than a level of power consumption of the second power state.

16. The method of claim 10, wherein the first clock signal is a data clock signal.

17. The method of claim 10, a differential signal pair includes the first clock signal and a second clock signal.

18. The method of claim 10, wherein the memory device includes a dynamic random access memory.

19. A memory controller comprising:
    configuration logic to determine a mode of operation of a memory device coupled to the memory controller; and
    scheduler logic to schedule communication of a command to the memory device based on the determined mode, including:
       the scheduler logic to schedule communication of a first portion of the command via a command/address bus for a first period, wherein a middle of the first period is synchronized with a first transition of a first clock signal provided by the memory controller to the memory device; and
       the scheduler logic to schedule communication of a second portion of the command via the command/address bus for a second period, wherein a middle of the second period is synchronized with a second transition of the first clock signal;
    wherein if the determined mode is a first mode, then the second transition is an Nth transition of the first clock signal after the first transition, wherein N is an integer greater than one, and if the determined mode is a second mode, the second transition is a next transition of the first clock signal after the first transition.

20. The memory controller of claim 19, wherein N is equal to 2 or 4.

21. The memory controller of claim 19, wherein the command is for a command/address bus training sequence.

22. The memory controller of claim 19, wherein the first clock signal is a data clock signal.

23. The memory controller of claim 19, a differential signal pair includes the first clock signal and a second clock signal.

24. The memory controller of claim 19, wherein the memory device includes a dynamic random access memory.

25. A method at a memory controller, the method comprising:
   determining a mode of operation of a memory device coupled to the memory controller
   scheduling communication of a command to the memory device based on the determined mode, including:
      scheduling communication of a first portion of the command via a command/address bus for a first period, wherein a middle of the first period is synchronized with a first transition of a first clock signal provided by the memory controller to the memory device; and
      scheduling communication of a second portion of the command via the command/address bus for a second period, wherein a middle of the second period is synchronized with a second transition of the first clock signal;
   wherein if the determined mode is a first mode, then the second transition is an Nth transition of the first clock signal after the first transition, wherein N is an integer greater than one, and if the determined mode is a second mode, the second transition is a next transition of the first clock signal after the first transition.

26. The method of claim 25, wherein N is equal to 2 or 4.

27. The method of claim 25, wherein the command is for a command/address bus training sequence.

28. The method of claim 25, wherein the first clock signal is a data clock signal.

29. The method of claim 25, a differential signal pair includes the first clock signal and a second clock signal.

30. The method of claim 25, wherein the memory device includes a dynamic random access memory.

* * * * *